US008906520B2

(12) United States Patent  
Seshadri

(10) Patent No.: US 8,906,520 B2  
(45) Date of Patent: Dec. 9, 2014

(54) SULFONATED POLYTHIOPHENES COMPRISING FUSED RING REPEAT UNITS

(75) Inventor: Venkataramanan Seshadri, Pittsburgh, PA (US)

(73) Assignee: Solvay USA, Inc., Cranbury, NJ (US)

( * ) Notice: Subject to any disclaimer, the term of this patent is extended or adjusted under 35 U.S.C. 154(b) by 587 days.

(21) Appl. No.: 12/996,766

(22) PCT Filed: Jun. 9, 2009

(86) PCT No.: PCT/US2009/046771  
§ 371 (c)(1),  
(2), (4) Date: Mar. 10, 2011

(87) PCT Pub. No.: WO2009/152165  
PCT Pub. Date: Dec. 17, 2009

(65) Prior Publication Data  
US 2011/0147725 A1 Jun. 23, 2011

Related U.S. Application Data

(60) Provisional application No. 61/060,081, filed on Jun. 9, 2008.

(51) Int. Cl.  
*H01L 51/54* (2006.01)  
*C09K 11/06* (2006.01)  
*C08G 75/06* (2006.01)  
*C08L 81/02* (2006.01)  
*C08K 5/101* (2006.01)  
*C08K 5/07* (2006.01)  
*C08K 5/41* (2006.01)  
*C08K 5/20* (2006.01)  
*C08K 5/1575* (2006.01)  
*C08K 5/1535* (2006.01)  
*C08G 61/12* (2006.01)  
*C08L 65/00* (2006.01)  
*C08G 65/334* (2006.01)  
*H01L 51/00* (2006.01)  
*C08G 65/337* (2006.01)

(52) U.S. Cl.  
CPC ............ *C08G 61/126* (2013.01); *C08L 65/00* (2013.01); *C08G 65/334* (2013.01); *H01L 51/0036* (2013.01); *Y02E 10/549* (2013.01); *C08G 65/337* (2013.01); *Y10S 428/917* (2013.01)  
USPC ........... 428/690; 428/917; 524/108; 524/113; 524/502; 524/500; 524/364; 524/173; 524/233; 525/417; 257/40; 257/E51.018

(58) Field of Classification Search  
None  
See application file for complete search history.

(56) References Cited

U.S. PATENT DOCUMENTS

| 5,315,014 A | 5/1994 | Ferraris et al. |
| 7,105,237 B2 | 9/2006 | Sotzing |
| 7,206,111 B2 | 4/2007 | Huang et al. |
| 7,321,012 B2 | 1/2008 | Sotzing |
| 2006/0078761 A1* | 4/2006 | Williams et al. ............. 428/690 |
| 2008/0248313 A1 | 10/2008 | Seshadri et al. |

FOREIGN PATENT DOCUMENTS

| EP | 0834885 B1 | 8/1998 |
| WO | WO 2005/111045 A1 | 11/2005 |
| WO | WO 2006/031893 A2 | 3/2006 |
| WO | WO 2006/084088 A1 | 8/2006 |

OTHER PUBLICATIONS

International Search Report and Written Opinion in related application PCT/US2009/046771 mailed Jan. 18, 2010.  
Coppo, P. et al. "Synthetic Routes to Solution-Processable Polycyclopentadithiophenes," 36 Macromol. 2705 (2003).  
Frey, J. et al., "Synthesis of Dithieno [3,2-b:2',3'-d]Thiophene," 83 Org. Synth. 209 (2006).  
Frey, J. et al., "Improved synthesis of dithieno[3,2-b:2,3-d]thiophene (DTT) and derivatives for cross coupling," 2002 Chem. Commun. 2424 (2002).  
Fuller, L. et al., "Thienothiophenes. Part 2.1 Synthesis, metallation and brominelithium exchange reactions of thieno[3,2-b]thiophene and its polybromo derivatives," 1997 J. Chem. Soc., Perkin Trans. 1 3465 (1997).  
He, M. et al., "Synthesis and Structure of Alkyl-Substituted Fused Thiophenes Containing up to Seven Rings," 72 J. Org. Chem. 442 (2007).  
Koeckelberghs, G. et al., "Influence of the Substituent and Polymerization Methodology on the Properties of Chiral Poly(dithieno[3,2-b:2',3'-d]pyrrole)s," 40 Macromolecules 4173 (2007).  
Lee, B., "Ring Sulfonated poly(thieno[3,4-b]thiophene)," 17 Adv. Mater. 1792 (2005).  
Pedulli, G. et al., "Rotational isomerism in the radical anions of bi- and ter-aryls containing the thiophen ring," 1978 J. Chem. Soc., Perkin Trans. 2 212 (1978).  
Remonen, T. et al, "New dithienothiophene donors for cation radical salts," 86 Synthetic Metals 1851 (1997).  
Udum, Y. et al., "Electropolymerization of self-doped polythiophene in acetonitrile containing FSO3H," 142 Synth. Met. 7 (2004).  
Udum, Y. et al, "Electrochemical synthesis of soluble sulfonated poly(3-methyl thiophene)," 40 Eur. Poly. J. 1057 (2004).  
Zhang, X. et al., "Synthesis and Structure of Fused a-Oligothiophenes with up to Seven Rings," 127 J. Am. Chem. Soc. 10502 (2005).

* cited by examiner

Primary Examiner — Andrew K Bohaty  
(74) Attorney, Agent, or Firm — The Marbury Law Group, PLLC

(57) ABSTRACT

A sulfonated polymer comprising a 3-substituted fused thienothiophene repeat unit, a composition comprising the polymer, a method of making the polymer, and a device comprising the polymer. The polymers can be used in hole injection or hole transport layers, or other applications in organic electronic devices.

20 Claims, No Drawings

SULFONATED POLYTHIOPHENES COMPRISING FUSED RING REPEAT UNITS

BACKGROUND

Although useful advances are being made in energy saving devices such as organic-based organic light emitting diodes (OLEDs), polymer light emitting diodes (PLEDs), and organic photovoltaic devices (OPVs), further improvements are still needed in providing better processing and performance. For example, one promising type of material is conducting polymers including for example polythiophenes and regioregular polythiophenes. However, problems can arise with doping, purity, and solubility and processing. In particular, it is important to have very good control over the solubility of alternating layers of polymer (e.g., orthogonal or alternating solubility properties among adjacent layers). In particular, hole injection layers and hole transport layers can present difficult problems in view of competing demands and the need for very thin, but high quality, films.

A need exists for a good platform system to control properties of hole injection and transport layers such as solubility, processability, stability, and electronic energy levels like HOMO and LUMO, so that the materials can be adapted for different applications and to function with different materials such as light emitting layers, photoactive layers, and electrodes. In particular, good solubility properties are important, as well as the control of energy levels like HOMO and LUMO and the ability to formulate the system for a particular application and provide the required balance of properties.

Polythiophenes are particularly important. Background references regarding polythiophenes include (1) Sotzing, G. A. Substituted thieno[3,4-b]thiophene polymers, method of making and use thereof, US2005/0124784 A1; (2) Lee, B.; Seshadri, V.; Sotzing, G. A. Ring Sulfonated poly(thieno[3, 4-b]thiophene), *Adv. Mater.* 2005, 17, 1792. (3) Udman,Y.A.; Pekmez, K.; Yildiz, A. *Synth. Met.* 2004, 142, 7. (4). Udman, Y. A.; Pekmez, K.; Yildiz, A. *Eur. Poly. J.* 2004, 40, 1057. (5) "*Method for producing soluble conductive polymers having acidic groups*" EP0834885B1.

Other references such as U.S. application Ser. No. 11/826, 394 to Venkataramanan Seshadri et al. filed on Jul. 13, 2007 describing sulfonation and sulfonated polymer products, *Org. Synth.* 2006, 83, 209-216, Koeckelberghs, et al. *Macromolecules* 2007, 40, 4173-4181, and Holmes et al., *Chem. Commun.* 2002, 2424-2426, US2004/0242792 to Sotzing et al., WO2006/084088 to Mather et al., U.S. Pat. No. 7,206,111 to Huang et al., U.S. Pat. No. 5,315,014 to Ferraris et al., are also incorporated by reference herewith.

SUMMARY

The application encompasses compositions, including monomers, polymers, and inks, as well as devices, articles, and also methods of making and using the compositions and devices.

For example, the present application, through various embodiments, provides for a sulfonated polymer comprising a 3-substituted fused thienothiophene repeat unit. In the polymer, the sulfonate is attached directly to the thiophene backbone. In some embodiments, the polymer comprises a repeat unit of formula

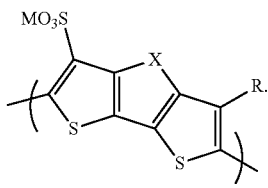

(Formula I)

R may be, for example, H, or optionally substituted branched or linear alkyl, optionally substituted branched or linear alkenyl, optionally substituted branched or linear alkynyl; optionally substituted branched or linear alkoxyl, optionally substituted polyether, optionally substituted acetyl, optionally substituted thioalkyl, or optionally substituted amino. X may be for example $CH_2$, O, S, Se, Te, $CR^1R^2$, $NR^3$, C=O, and C=$CR^1R^2$, wherein $R^1$, $R^2$, and $R^3$ are independently optionally substituted branched or linear alkyl, optionally substituted branched or linear alkenyl, optionally substituted branched or linear alkynyl; optionally substituted alkoxyl, optionally substituted polyether, optionally substituted acetyl, optionally substituted thioalkyl, optionally substituted amino. In some embodiments, the polymer is partially in salt form. When the polymer is in a salt form, M is a cation, such as $Li^+$, $Na^+$, $K^+$, $Cs^+$, or $R_4N^+$, where R is H or alkyl (C1-C4 optionally substituted). When the polymer is in sulfonic acid form, M is hydrogen.

The present application further provides for a method of making the sulfonated polymer. In some embodiments, the method comprises sulfonation of a polymer of structure of

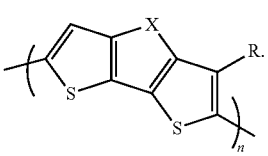

(Formula II)

The sulfonated polymer of the present application may also be prepared by polymerization of the sulfonated monomer.

The present application further provides for a composition comprising the sulfonated polymer. In some embodiments, the composition comprises the sulfonated polymer and a suitable solvent wherein the polymer is soluble or dispersible.

The present application through various embodiments further provides for a device comprising the aforementioned polymer or composition.

An advantage in at least some embodiments is that the fused thienothiophene repeat unit can have a forced cisoid conformation. Such conformation alters the energy levels of a simple alternating copolymer of the 3-alkoxythiophene and thiophene.

An additional advantage for at least some embodiments is that the bridge head can electronically communicate with the rest of the polymer backbone, thus allowing manipulation of the polymer's electrical and optical properties. For example, when the bridge head is a methylene group, the acidic proton on the bridge-head will allow easy substitution to enable covalent attachment of functional groups that aid processing. Additionally, since the bridge-head carbon can electronically communicate with the rest of the polymer backbone, electron donating or withdrawing groups at this position could further alter the polymer properties.

Other advantages for at least some embodiments include for example stability of repeat units to excited states owing to the delocalization of the charge passing through the system over a larger fused ring system.

DETAILED DESCRIPTION

Introduction

All references cited herein are incorporated by reference in their entirety.

U.S. patent application Ser. No. 11/826,394 to Seshadri et al. describes that sulfonation and sulfonated polymers can be used to improve performance and process, particularly with polythiophenes. Its teaching is incorporated by reference in its entirety.

Introduction of substitution to polythiophene backbone allows for variability in the electrical and optical properties of the polymer. Sulfonation and subsequent introduction of counter ion can produce self-doped conducting polythiophene. Sulfonation may further provide better solubility, and therefore processability of the polymer.

Polymer

The present application, through various embodiments, provides for a sulfonated polymer comprising an optionally substituted fused thienothiophene repeat unit. In the polymer, the sulfonate is attached directly to the thiophene backbone. In some embodiments, the polymer comprises a repeat unit of formula

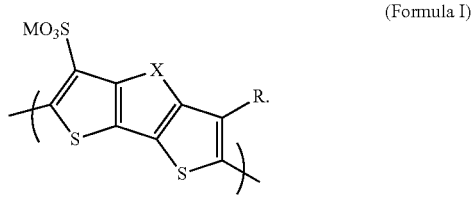

(Formula I)

R is selected from H, optionally substituted branched or linear alkyl, optionally substituted branched or linear alkenyl, optionally substituted branched or linear alkynyl, optionally substituted branched or linear alkoxyl, optionally substituted polyether, optionally substituted acetyl, optionally substituted thioalkyl, and optionally substituted amino; In addition, R may be those described in U.S. application Ser. No. 11/826,394, which is incorporated by reference in its entirety.

X is selected from $CH_2$, O, S, Se, Te, $CR^1R^2$, $NR^3$, C=O, and $C=CR^1R^2$, wherein $R^1$, $R^2$, and $R^3$ are independently selected from optionally substituted branched or linear alkyl, optionally substituted branched or linear alkenyl, optionally substituted branched or linear alkynyl, optionally substituted branched or linear alkoxyl, optionally substituted polyether, optionally substituted acetyl, optionally substituted thioalkyl, and optionally substituted amino. In some embodiments, the polymer is partially in salt form. When the polymer is in a salt form, M is a cation, such as $Li^+$, $Na^+$, $K^+$, $Cs^+$, or $R_4N^+$, where R is H or alkyl (C1-C4 optionally substituted). When the polymer is in sulfonic acid form, M is hydrogen.

In some embodiments, the backbone tricyclic ring is substituted by an alkoxyl or an alkyl group at 3-position.

The degree of sulfonation, or the percentage of the polymer repeat unit being sulfonated, may range from about 10% to about 95%. In some embodiments, the range is about 50% to about 95%, and in some other embodiments, the range is about 75% to about 95%.

In some embodiments, the sulfonated portion of the polymer may be in sulfonic acid form or in a salt form. The salt form comprises an organic or inorganic counterion (cation). The cation may be $NH_4+$, Na+, or K+. In some embodiments, the salt form is present in amounts ranging from about 10% to about 95% percent. In other embodiments, the salt form is present in amounts from about 50% to about 95% or about 75% to about 95%. The solubility of the polymer varies according to the degree of sulfonation and salting.

The polymer in the various embodiments may be homopolymer wherein the repeat units have the same backbone. It may also be copolymer wherein the tricyclic fused thiophene repeat unit is coplymerized with other thiophene repeat units such as, for example, a single optionally substituted thiophene ring. The copolymer may further be block polymer wherein several of the same repeat units form a block segment. The copolymer may comprise one or more regioregular block segments, wherein the regioregularity may range from about 30% to about 95%.

The polymer in the various embodiments may be a regioregular polymer. In some embodiments, the regioregularity is at least about 70%, about 80%, about 90%, about 95%, or about 98%.

The polymer comprising repeat units of formula I can have a number average molecular weight, for example, ranging from about 1,000 Da to about 10,000,000 Da, from about 5,000 Da to about 10,000,000 Da, from about 5,000 to about 100,000 Da, or from about 5,000 Da to about 50,000 Da.

Inks

One or more dispersants can be used to suspend solids and form inks, which may be used to form films or coatings. The present application, through various embodiments, further provides for a composition comprising the sulfonated polymer. In some embodiments, the composition comprises: (A) water, (B) the sulfonated polythiophene, and (C) a synthetic polymer different from (B).

Solvent

In some embodiments, the polymer (B) is water soluble or dispersible or swellable. Water can be used as dispersant. In some embodiments, there may be a second solvent which is organic solvent such as ethyl acetate, acetone, DMSO, DMF, dioxane, THF, and a combination thereof, wherein the weight amount of water is greater than the weight amount of the organic co-solvent. In other embodiments, the second solvent may be a combination of two or more organic solvents. The solvent may be those described in U.S. application Ser. No. 11/826,394, which is incorporated by reference in its entirety.

Second Polymer

In some embodiments, the composition further comprises a polymer other than (B). The polymers other than (B) may be water soluble or dispersible. They may comprise a polystyrene, a polystyrene derivative, a polyurethane, a polyacrylate, a polypyridine, or a polyvinyl phenol.

Amounts

The relative amount of the materials in the composition may be those described in U.S. application Ser. No. 11/826,394, which is incorporated by reference in its entirety.

For example, in the composition, the sulfonated polythiophene may be about 5 wt./% to about 50 wt. % with respect to the total amount of (B) and (C) or additional polymer other than (B) and (C).

Method of Making

Monomers can be made by methods known in the art including for example:

Org. Synth. 2006, 83, 209-216 describes the synthesis of tricyclic fused thiophene wherein the bridgehead is S (dithieno[3,2-b:2',3'-d]thiophene).

Koeckelberghs, et al. Macromolecules 2007, 40, 4173-4181 describes the synthesis of tricyclic fused thiophene wherein bridgehead is an amino group (N-functionalized dithioe[3,2-b;2',3'-d]pyrroles.

U.S. Pat. No. 7,206,111 to Huang et al. describes tricyclic fused thiophene wherein the bridgehead is O, S, Se, or alkylene.

U.S. Pat. No. 5,315,014 to Ferraris et al. describes tricyclic fused thiophene wherein bridgehead is C=CWZ, wherein W and Z are independently —CN, —NO$_2$, aryl, SO$_2$R, alkyl.

U.S. 2004/0242792 to Sotzing et al. and WO2006/084088 to Mather et al. describe tricyclic fused thiophene wherein the bridge head is S, O, N—H and N—R.

These references are incorporated by reference in their entirety herewith.

The present application, through various embodiments, further provides for a method of making the sulfonated polymer. In some embodiments, the method comprises sulfonation of an oligomer or a polymer of structure of

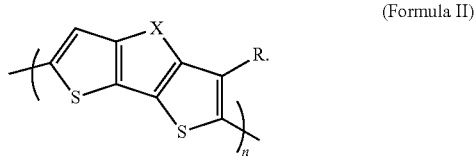

(Formula II)

X and R are as previously defined, n is at least 2, and may be ranging from 2 to 100,000, or from 100 to 50,000, or from 500 to 5,000, etc.

The polymer can have a number average molecular weight, for example, ranging from about 1,000 Da to about 10,000,000 Da, from about 5,000 Da to about 10,000,000 Da, from about 5,000 to about 100,000 Da, or from about 5,000 Da to about 50,000 Da.

The sulfonation may be done by reacting the polymer with a sulfonation reagent such as for example fuming sulfuric acid. It may also be done by reacting the polymer with other suitable sulfonating reagents such as acetyl sulfate or pyridine SO$_3$. The sulfonating reagent may be those described in U.S. application Ser. No. 11/826,394, which is incorporated by reference in its entirety.

Polymerization can be carried out by methods known in the art for polymerizing thiophenes, such as McCullough method, GRIM, universal Grim, mixed halogen Grim, living Grim, Stille and Suzuki coupling methods, etc.

The present application further provides for a method of making the ink composition. The method comprises: (A) providing water, (B) providing sulfonated polythiophene, (C) providing a synthetic polymer different from (B), (D) combining in any order (A), (B), and (C) to form a coating composition.

Articles/Devices

The present application, through various embodiments, provides for a coated substrate comprising: a solid surface, a coating disposed on the surface, wherein the coating comprises a composition comprising: a water soluble or water dispersible or water swellable sulfonated polythiophene.

The coating composition may further comprise (C) a synthetic polymer different from (B).

The present application through various embodiments provides for a device comprising a layer comprising the composition as described above. In the device, the layer can be, for example, a hole injection layer or a hole transport layer. The device is an OLED device, a PLED device, SMOLED device, or a photovoltaic device.

In some embodiments, the device comprises at least two electrodes and at least one light emitting or photoactive layer. The device may be a sensor, a supercapacitor, a cation transducer, a drug release device, an electrochromic device, a transistor, a field effect transistor, an actuator, or a transparent electrode.

The presently claimed device comprises a hole injection layer or a hole transport layer, the layer comprising a sulfonated polythiophene polymer as described above.

In some embodiments, the sulfonated polythiophene polymer and other polymer(s) can form a compatible blend.

In some embodiments of the device, the coating has a thickness of about 10 nm to about 100 nm. The polymer other than polythiophene can comprise a polystyrene, a polystyrene derivative, a polyurethane, a polyacrylate, a polypyridine, or a polyvinyl phenol.

In some embodiments of the device, the transparency of the material is at least 90% over the wavelength region of about 300 nm to about 800 nm. The coating material is doped with solids, liquids, gases, or a combination thereof.

The device may be a component of a semiconductor device, display screen, projector, aircraft wide screen, vehicular wide screen or CRT screens. The coating may reduce electrostatic charge on a device.

Doping

The polymer material of the present invention may be self-doped. The polymer material of the present invention may be alternatively doped or additionally doped using organic, inorganic or ambient dopants. In some embodiment, the polythiophene may be oxidized. In other embodiments, the material is doped with Br, I, Cl or any combination thereof. The polymer composition may be doped with iron trichloride, gold trichloride, arsenic pentafluoride, alkali metal salts of hypochlorite, protic acids, benzenesulfonic acid and derivatives thereof, propionic acid, organic carboxylic and sulfonic acids, nitrosonium salts, NOPF$_6$, NOBF$_4$, organic oxidants, tetracyanoquinone, dichlorodicyanoquinone, hypervalent iodine oxidants, iodosylbenzene, iodobenzene diacetate or a combination thereof.

In some embodiments of the device, the composition further comprises protic organic acids, inorganic acids, benzenesulfonic acids and derivatives thereof, propionic acid, organic carboxylic acids, sulfonic acids, mineral acids, nitric acids, sulfuric acids and hydrochloric acids. In other embodiments of the device, the material further comprises tetracyanoquinone, dichlorodicyanoquinone, hypervalent iodine, iodosylbenzene, iodobenzene diacetate or a combination thereof.

Terms of Art

Various terms are further described herein below:

"Alkyl" refers to straight chain and branched monovalent alkyl groups having from 1 to 20 carbon atoms, or from 1 to 15 carbon atoms, or from 1 to 10, or from 1 to 5, or from 1 to 3 carbon atoms. This term is exemplified by groups such as for example methyl, ethyl, n-propyl, iso-propyl, n-butyl, t-butyl, n-pentyl, ethylhexyl, dodecyl, isopentyl, and the like.

"Optionally substituted" groups refers to functional groups that may be substituted or unsubstituted by additional functional groups. For example, when a group is unsubstituted by an additional group it can be referred to as the group name, for example alkyl or aryl. When a group is substituted with additional functional groups it may more generically be referred to as substituted alkyl or substituted aryl.

"Substituted alkyl" refers to an alkyl group having from 1 to 3 substituents selected from the group consisting of alkyl, substituted alkyl, alkoxy, substituted alkoxy, aryl, substituted aryl, aryloxy, substituted aryloxy, and hydroxyl.

"Aryl" refers to a monovalent aromatic carbocyclic group of from 6 to 14 carbon atoms having a single ring (e.g., phenyl) or multiple condensed rings (e.g., naphthyl or anthryl) which condensed rings may or may not be aromatic provided that the point of attachment is at an aromatic carbon atom. For example, aryl includes, but is not limited to, phenyl, naphthyl, and the like.

"Substituted aryl" refers to an aryl group with from 1 to 5 substituents, or optionally from 1 to 3 substituents, or optionally from 1 to 2 substituents, selected from the group consisting of hydroxy, alkyl, substituted alkyl, alkoxy, substituted alkoxy, alkenyl, substituted alkenyl, substituted aryl, aryloxy, substituted aryloxy, and sulfonate "Alkoxy" refers to the group "alkyl-O-" which includes, by way of example, methoxy, ethoxy, n-propyloxy, iso-propyloxy, n-butyloxy, t-butyloxy, n-pentyloxy, 1-ethylhex-1-yloxy, dodecyloxy, isopentyloxy, and the like.

"Substituted alkoxy" refers to the group "substituted alkyl-O—."

"Alkenyl" refers to an alkenyl group having from 2 to 6 carbon atoms or from 2 to 4 carbon atoms and having at least 1 and from 1-2 sites of alkenyl unsaturation. Such groups are exemplified by vinyl, allyl, but-3-en-1-yl, and the like.

"Substituted alkenyl" refers to alkenyl groups having from 1 to 3 substituents, and preferably 1 to 2 substituents, selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic with the proviso that any hydroxyl substitution is not attached to a vinyl (unsaturated) carbon atom.

"Aryloxy" refers to the group aryl-O— that includes, by way of example, phenoxy, naphthoxy, and the like.

"Substituted aryloxy" refers to substituted aryl-O-groups.

"Alkylene oxide" refers to the group —($R^a$—O)$_n$—$R^b$ where $R^a$ is alkylene and $R^b$ is alkyl or optionally substituted aryl and n is an integer from 1 to 6, or from 1 to 3. Alkylene oxide can be for example groups based on such as groups as ethylene oxides or propylene oxides.

"Salt" refers to a compound or polymer derived from a variety of organic and inorganic counter ions well known in the art and include, by way of example only, sodium, potassium, calcium, magnesium, ammonium, tetraalkylammonium, and the like; and when the molecule contains a basic functionality, salts of organic or inorganic acids, such as hydrochloride, hydrobromide, tartrate, mesylate, acetate, maleate, oxalate and the like.

In substituted groups described above, polymers arrived at by describing substituents with further substituents to themselves (e.g., substituted aryl having a substituted aryl group as a substituent which is itself substituted with a substituted aryl group, etc.) are not intended for inclusion herein. In such cases, the maximum number of such substituents is three. That is to say that each of the above descriptions can be constrained by a limitation that, for example, substituted aryl groups are limited to -substituted aryl-(substituted aryl)-substituted aryl.

EXAMPLES 1.1 Synthesis of 3-Bromo-thieno[3,2-b]thiophene-2-carbaldehyde

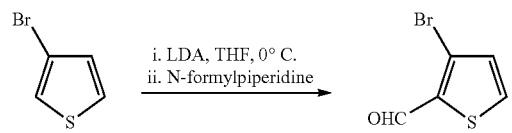 [SMILES: Brc1ccsc1 ; O=Cc1sccc1Br]

Synthesis of the aldehyde has been reported by Fuller et al. in *J. Chem. Soc., Perkin Trans.* 1, 1997, 3465 starting from 3-bromothiophene.

1.2 Synthesis of Thieno[3,2-b]thiophene-2-carboxylic acid ethyl ester

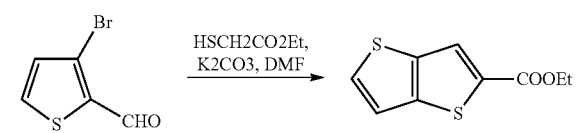 [SMILES: O=Cc1sccc1Br ; CCOC(=O)c1cc2sccc2s1]

Synthesis of the thienothiophene carboxylic acid ester has been reported by Fuller et al. in *J. Chem. Soc., Perkin Trans.* 1, 1997, 3465.

1.3 Synthesis of Thieno[3,2-b]thiophene-2-carboxylic acid

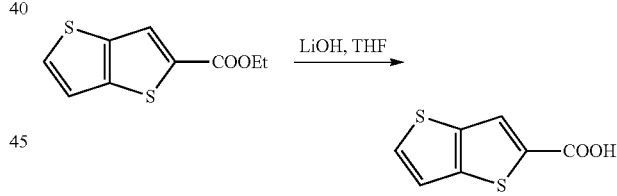

Synthesis of the thienothiophene carboxylic acid has been reported by Fuller et al. in *J. Chem. Soc., Perkin Trans.* 1, 1997, 3465.

1.4 Synthesis of 2,3,5-Tribromo-thieno[3,2]-thiophene

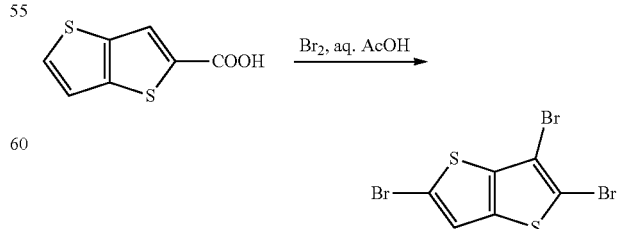

Synthesis of the tribromothienothiophene has been reported by Fuller et al. in *J. Chem. Soc., Perkin Trans.* 1, 1997, 3465.

1.5 Synthesis of 3-Bromo-thieno[3,2]-thiophene

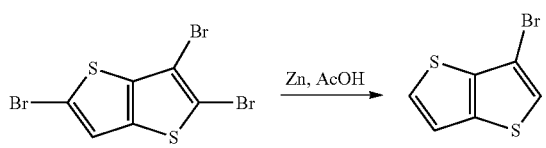

Fuller et al. describes the synthesis of 3,6-dibromothieno[3,2-b]thiophene starting from 2,3,5,6-tetrabromothieno[3,2-b]thiophene in *J. Chem. Soc., Perkin Trans.* 1, 1997, 3465. Using the same procedure, instead starting from 2,3,5-tribromothieno[3,2-b]thiophene will yield the 3-bromothieno[3,2-b]thiophene.

1.6 Synthesis of 3-[2-(2-Methoxy-ethoxy)-ethoxy]-thieno[3,2-b]thiophene

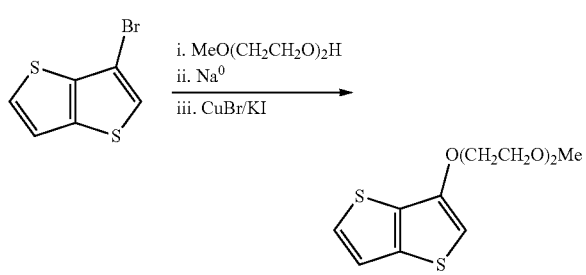

To a clean dry 100 mL RBF dry 16.44 g, 3 eq of methoxyethoxyethanol is added followed by 4.72 g, 1.5 eq of Na metal. The mixture is stirred at RT for 4-5 hrs and then heated to 90-100° C. till al the metal dissolved. To this mixture, 10 g, 1 eq. of 3-bromothieno[3,2-b]thiophene is added and immediately after that 0.65 g, 10 mol % CuBr+0.38 g, 0.5 mol % KI is added. The reaction mixture is then heated to 90° C. for 24 h. After diluting the RM with 200 mL hexanes, the solids are filtered. The RM is then extracted thrice with 100 mL 1 N HCl, 3×100 mL satd. Ammonium chloride soln, 3×100 mL de-ionized water. The organic layer is then dried over an. $MgSO_4$, concentrated and purified via column chromatograph using 80:20 (v/v) hexanes-ethylacetate mixture.

1.7 Bromination of 3-[2-(2-Methoxy-ethoxy)-ethoxy]-thieno[3,2-b]thiophene

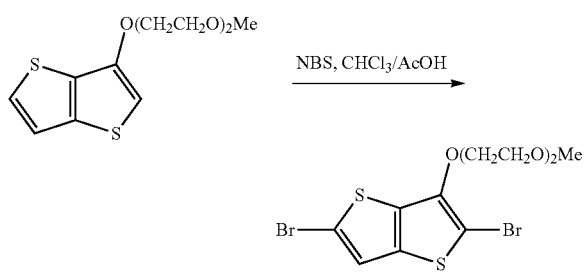

10 g of 3-[2-(2-Methoxy-ethoxy)-ethoxy]-thieno[3,2-b]thiophene is added to a clean dry 250 mL RBF. To this pot added 100 mL of 1:1 v/v chloroform-glacial acetic acid. To this solution 13.78 g NBS is added and the reaction continued at RT till bromination is completed. The RM is then washed with satd. $NaHCO_3$ solution till neutral followed by 3×100 mL de-ionized water. The organic layer is then dried over $MgSO_4$ (anhyd), concentrated and purified via column chromatograph using 80:20 (v/v) hexanes-ethylacetate mixture.

1.8 Synthesis of poly(3-[2-(2-Methoxy-ethoxy)-ethoxy]-thieno[3,2-b]thiophene)

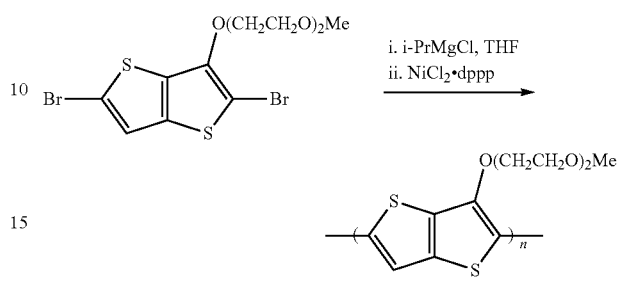

To a flame dried flask 10 g of 2,5-dibromo-3-[2-(2-Methoxy-ethoxy)-ethoxy]-thieno[3,2-b]thiophene is added and diluted with anhyd. THF to make a 0.1 M solution. To this solution 12.0 mL 2.0 M i-PrMgCl in THF is added at RT and stirred at RT for 1 h. After conversion of the dibromothiophene to the monobromo monogrignard 0.26 g bis(diphenylphosphino)propane nickel (II) chloride suspended in 5 mL anhydrous THF is added to the monomer solution and the reaction continued at a gentle reflux for 12 h. The polymerization is quenched using 5 mL 5 N methanolic HCl. The polymer is then precipitated into 10 times the volume of 40:60 (v/v) ethanol-water. The polymer is filtered and washed 3 times in 100 mL 10% methanolic HCl followed by a hot water wash. The polymer is then dried in vacuo @50° C. for 24 hrs before the sulfonation step.

1.9 Sulfonation of poly(3-[2-(2-Methoxy-ethoxy)-ethoxy]-thieno[3,2-b]thiophene)

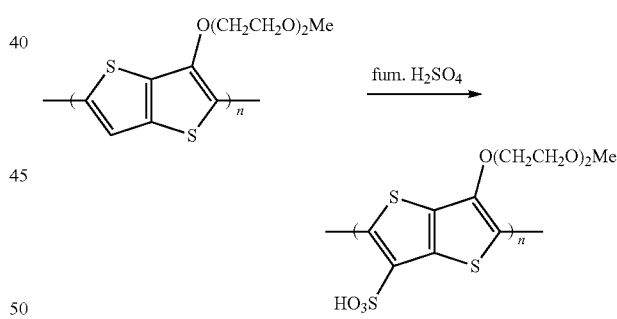

1 g of poly(3-[2-(2-Methoxy-ethoxy)-ethoxy]-thieno[3,2-b]thiophene) is added to a 100 mL RBF followed by 30 mL fuming sulfuric acid. The RM is then heated to 80° C. for 24 hrs before quenching it into 150 mL de-ionized water. The polymer is then washed several times with water to remove the free acid. Any residual free acid will be removed by passing the aqueous dispersion of sulfonated poly(3-[2-(2-Methoxy-ethoxy)-ethoxy]-thieno[3,2-b]thiophene) through a OH form ion-exchange resin.

2.1 Synthesis of dithieno[3,2-b:2,3'-d]thiophene

The total synthesis of dithieno[3,2-b:2',3'-d]thiophene is described by Frey et al. in *Chem. Commun.*, 2002, 2424 starting from 2,3,4,5-tetrabromothiophene (see scheme below).

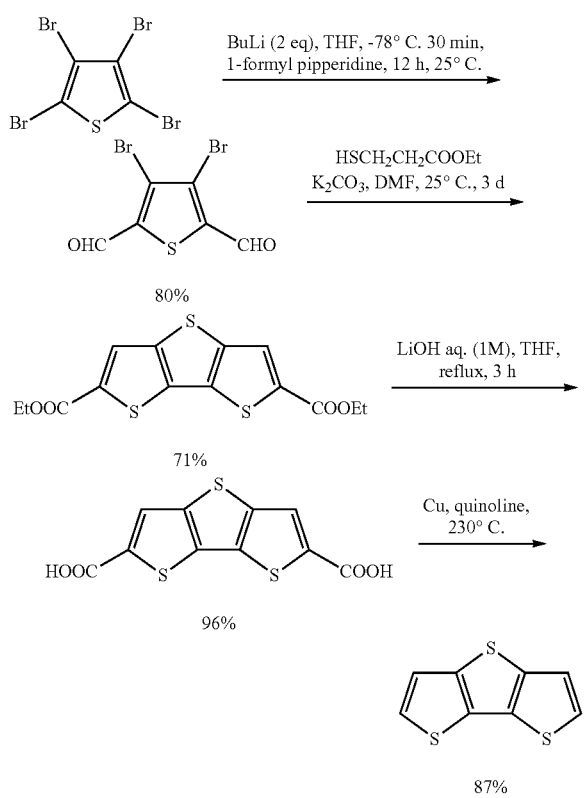

2.2 Synthesis of 2-bromo dithieno[3,2-b:2,3'-d]thiophene

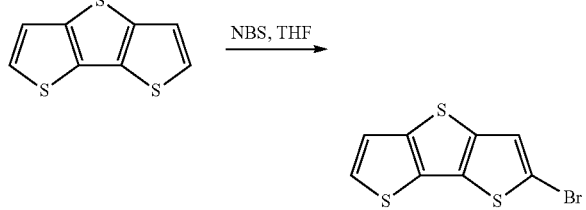

Bromination of dithieno[3,2-b:2',3'-d]thiophene with 1 eq of NBS using literature report Pedulli, G. F.; Tiecco, M.; Guerra, M.; Martelli G.; Zanirato, P. *J. Chem. Soc., Perkin Trans.* 2, 1978, 212.

2.3 Conversion of 2-bromo to 3-bromo dithieno[3,2-b:2,3'-d] thiophene

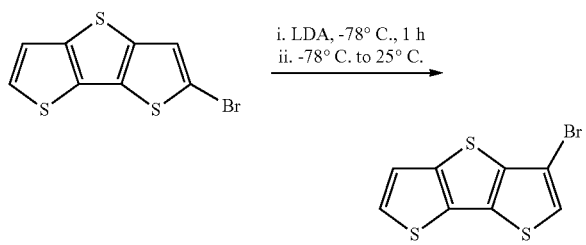

Pedulli et al notes the halogen migrate to the 3 position when deprotonated at very low temperatures and silylating at −78° C. and then allowing the temperature to raise to 25° C. overnight. He and Zhang in their *J. Org. Chem.* 2007, 72, 442 article also describe the migration of Br from the 2 position to 3 position by similar reaction. Also, Matzger and co-workers report the silylated 2-bromodithienothiophene undergo the same transformation *J. Am. Chem. Soc.* 2005, 127, 10502 using the same reaction protocol (see the procedure given below).

To a solution of diisopropylamine (2.80 mL, 20.0 mmol) in THF (250 mL) at 0° C. was added butyllithium (1.6 M in hexanes, 11.1 mL, 17.8 mmol) under a $N_2$ atmosphere. After stirring for 30 min at 0° C., the flask was placed in a −78° C. bath. (6-Bromo-dithieno[3,2-b;2',3'-d]thiophen-2-yl)-triisopropyl-silane (5.54 g, 14.8 mmol, dissolved in 30 mL THF) was then added into the reaction mixture. The solution was allowed to slowly warm up to room temperature. After stirring for 17 h, the flask was placed in a 0° C. bath, diluted with hexanes (200 mL), and quenched with brine (200 mL). The organic layer was collected and dried over anhydrous $Na_2SO_4$. After removing the solvent in vacuo, the product was purified by column chromatography on silica gel (hexanes) to yield (5-Bromo-dithieno[3,2-b;2',3'-d]thiophen-2-yl)-triisopropyl-silane.

The above procedure will be applied to the 2-bromodithieno[3,2-b;2',3'-d]thiophene to obtain the 3-bromo derivative.

2.4 Sulfonated poly(3-alkoxydithieno[3,2-b;2',3'-d] thiophen-2,5-diyl)

Sulfonated poly(3-alkoxydithieno[3,2-b;2',3'-d]thiophen-2,5-diyl) will be obtained as per the synthetic scheme shown below. The synthetic procedures will be the same described for thieno[3,2-b]thiophene except that the dithieno[3,2-b;2', 3'-d]thiophene derivatives will be used (see 1.6 through 1.9).

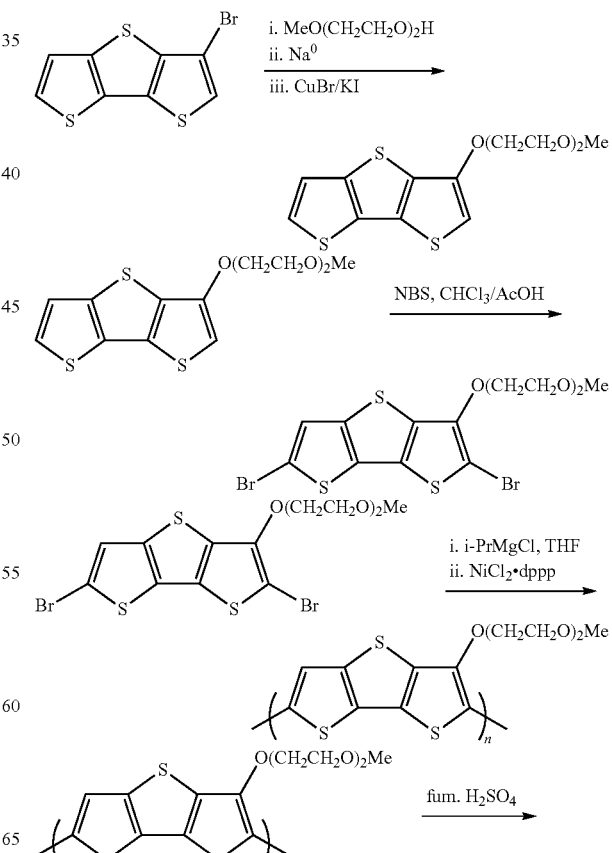

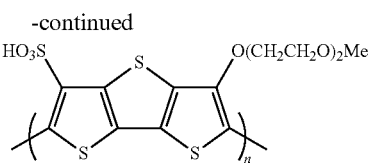

3.0 Synthesis of Sulfonated poly(3-[2-(2-Methoxy-ethoxy)-ethoxy]-4,4-dimethyl-4H-cyclopenta[2,1-b;3,4-b']dithiophene)

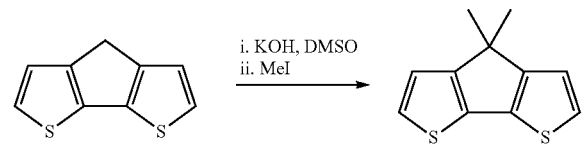

Procedure similar to literature report except using the iodomethane instead of the other alkylbromides reported by Coppo et al. (*Macromol.* 2003, 36, 2705).

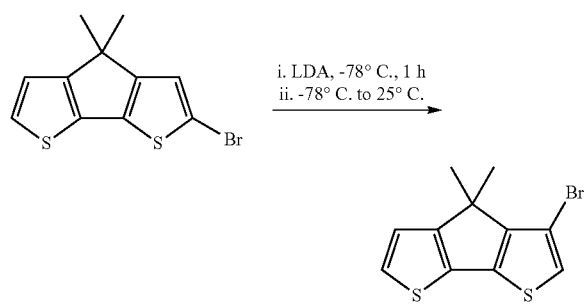

Synthetic procedure for 2.2 can be adopted for this compound.

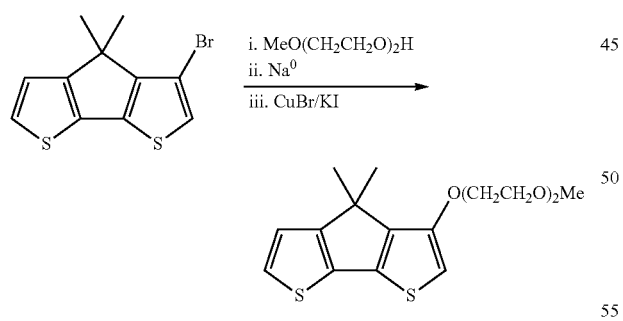

Synthetic procedure for 2.3 can be adopted for this compound.

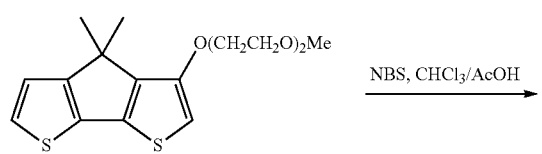

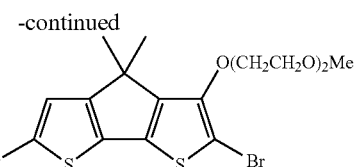

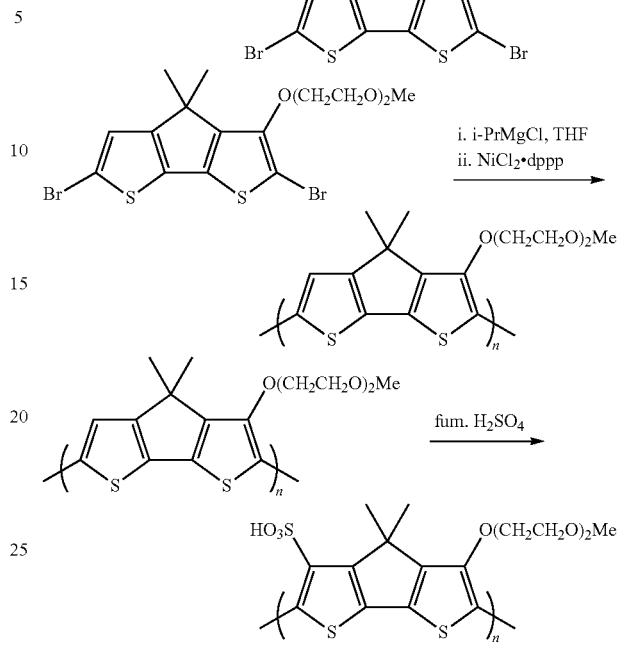

Synthetic procedure 1.6 though 1.9 can be adopted for the synthesis of the sulfonated poly(cyclopentadithiophene) (see scheme above).

What is claimed is:

1. A composition comprising at least one polymer comprising a repeat unit represented by Formula I:

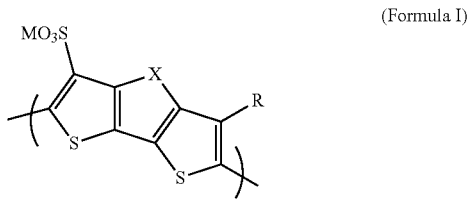

(Formula I)

wherein:
  M is selected from H, and organic cations and, a metal cation;
  R is selected from optionally substituted branched or linear alkoxyl, and optionally substituted polyether,
  X is selected from $CH_2$, O, S, Se, Te, $CR^1R^2$, $NR^3$, C=O, and $C=CR^1R^2$, wherein $R^1$, $R^2$, and $R^3$ are each independently selected from optionally substituted branched or linear alkyl, optionally substituted branched or linear alkenyl, optionally substituted branched or linear alkynyl; optionally substituted branched or linear alkoxyl, optionally substituted polyether, optionally substituted acetyl, optionally substituted thioalkyl, and optionally substituted amino.

2. The composition of claim 1, wherein R is optionally substituted branched or linear alkoxyl.

3. The composition of claim 1, wherein R is optionally substituted polyether.

4. The composition of claim 1, wherein R is a linear alkoxy.

5. The composition of claim 1, wherein X is S or O.

6. The composition of claim 1, wherein X is $CR^1R^2$, wherein $R^1$ and $R^2$ are each independently selected from optionally substituted branched or linear alkyl, optionally substituted branched or linear alkenyl, optionally substituted branched or linear alkynyl; optionally substituted branched or linear alkoxyl, optionally substituted polyether, optionally substituted acetyl, optionally substituted thioalkyl, and optionally substituted amino.

7. The composition of claim 1, wherein the polymer has a number average molecular weight of about 1,000 Da to about 10,000,000 Da.

8. The composition of claim 1, wherein the polymer has a number average molecular weight of about 5,000 Da to about 100,000 Da.

9. The composition of claim 1, wherein at least a portion of the polymer is in salt form.

10. The composition of claim 1, wherein the degree of sulfonation is about 30% to about 95%.

11. The composition of claim 1, wherein the polymer is a copolymer.

12. The composition of claim 1, wherein the polymer is a regioregular polymer.

13. A method of making the polymer of the composition of claim 1, comprising sulfonating a polymer of the following formula II:

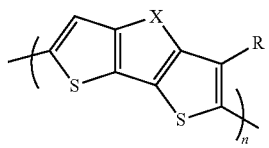

(Formula II)

wherein:
R is selected from optionally substituted branched or linear alkoxyl, and optionally substituted polyether,
X is selected from $CH_2$, O, S, Se, Te, $CR^1R^2$, $NR^3$, C=O, and C=$CR^1R^2$, wherein $R^1$, $R^2$, and $R^3$ are each independently selected from optionally substituted branched or linear alkyl, optionally substituted branched or linear alkenyl, optionally substituted branched or linear alkynyl; optionally substituted branched or linear alkoxyl, optionally substituted polyether, optionally substituted acetyl, optionally substituted thioalkyl, and optionally substituted amino,
n is at least 2.

14. A composition comprising: (A) water, (B) sulfonated polythiophene of claim 1, and (C) a synthetic polymer different from (B).

15. The composition of claim 14, further comprising a second solvent selected from ethyl acetate, acetone, DMSO, DMF, dioxane, THF, and a combination thereof.

16. The composition of claim 14, wherein the synthetic polymer other than (B) or (C) is a polystyrene, a polystyrene derivative, a polyurethane, a polyacrylate, a polypyridine, or a polyvinyl phenol.

17. The composition of claim 14, wherein the sulfonated polythiophene (B) is about 5 wt. % to about 50 wt. % with respect to the total amount of (B) and (C) or additional polymer other than (B) and (C).

18. A device comprising a coating layer comprising the polymer composition of claim 1.

19. The device of claim 18, wherein the layer is a hole injection layer or a hole transport layer.

20. The device of claim 18, wherein the device is an OLED device, a PLED device, SMOLED device, and a photovoltaic device.

* * * * *